US012763735B2

(12) United States Patent
Tokuda

(10) Patent No.: US 12,763,735 B2
(45) Date of Patent: Oct. 13, 2026

(54) AMPLIFIER WITH TRANSMISSION LINE TRANSFORMER MATCHING NETWORK

(71) Applicant: Murata Manufacturing Co., Ltd., Kyoto (JP)

(72) Inventor: Masamichi Tokuda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 565 days.

(21) Appl. No.: 18/340,194

(22) Filed: Jun. 23, 2023

(65) Prior Publication Data

US 2023/0336130 A1 Oct. 19, 2023

Related U.S. Application Data

(63) Continuation of application No. PCT/JP2021/045087, filed on Dec. 8, 2021.

(30) Foreign Application Priority Data

Dec. 28, 2020 (JP) ................................ 2020-218172

(51) Int. Cl.
*H03F 1/56* (2006.01)
*H03F 1/22* (2006.01)
(Continued)

(52) U.S. Cl.
CPC ............ *H03F 1/565* (2013.01); *H03F 1/223* (2013.01); *H03F 1/42* (2013.01); *H03F 3/193* (2013.01);
(Continued)

(58) Field of Classification Search
CPC .... H03F 1/565; H03F 1/223; H03F 2200/451; H03F 3/193; H03F 3/245; H03F 2200/222; H03F 2200/387; H03F 3/601; H03F 1/42
(Continued)

(56) References Cited

U.S. PATENT DOCUMENTS 7,898,340 B2 * 3/2011 Heston ...................... H01P 5/02 330/276
2016/0233839 A1 * 8/2016 Lin ......................... H03F 1/565
(Continued)

FOREIGN PATENT DOCUMENTS

CN 101183878 A * 5/2008
CN 107636975 A 1/2018
(Continued)

OTHER PUBLICATIONS

International Search Report for PCT/JP2021/045087 dated Jan. 25, 2022.

*Primary Examiner* — Andrea Lindgren Baltzell
*Assistant Examiner* — Lance Torbjorn Bartol
(74) *Attorney, Agent, or Firm* — McDonald Hopkins LLC

(57) ABSTRACT

An amplifier includes a transistor on a side to which a radio-frequency signal is input and a transistor on a side to which the radio-frequency signal is output that are connected in cascode. The amplifier includes an input matching network connected to an input end of the transistor, and an output matching network connected to an output end of the transistor. The input matching network includes a transmission line transformer. The transmission line transformer includes lines. One of the lines is connected between an input terminal for the radio-frequency signal and the transistor. The other line is disposed so as to be able to couple to the line via an electromagnetic field, one end thereof is connected to a node between the line and the input terminal for the radio-frequency signal, and another end thereof is connected between the line and a ground potential.

17 Claims, 5 Drawing Sheets

(51) Int. Cl.
*H03F 1/42* (2006.01)
*H03F 3/193* (2006.01)
*H03F 3/24* (2006.01)
*H03F 3/60* (2006.01)

(52) U.S. Cl.
CPC ............. *H03F 3/245* (2013.01); *H03F 3/601* (2013.01); *H03F 2200/222* (2013.01); *H03F 2200/387* (2013.01); *H03F 2200/451* (2013.01)

(58) Field of Classification Search
USPC ................................. 330/302, 190, 197, 285
See application file for complete search history.

(56) References Cited

U.S. PATENT DOCUMENTS

| | | | | |
|---|---|---|---|---|
| 2016/0336983 | A1 | 11/2016 | Wang et al. | |
| 2017/0194918 | A1* | 7/2017 | Wallis | H03F 1/223 |
| 2018/0026589 | A1* | 1/2018 | Labanc | H03F 1/42<br>156/345.48 |
| 2020/0076383 | A1 | 3/2020 | Hase | |
| 2021/0203296 | A1* | 7/2021 | Tsai | H03F 1/0261 |

FOREIGN PATENT DOCUMENTS

| | | | | |
|---|---|---|---|---|
| JP | H1168474 | A * | 3/1999 | |
| JP | 2012-147307 | A | 8/2012 | |
| JP | 2018-518889 | A | 7/2018 | |
| JP | 2020-038957 | A | 3/2020 | |
| WO | WO-2009060264 | A1 * | 5/2009 | H03F 3/601 |

* cited by examiner

AMPLIFIER WITH TRANSMISSION LINE TRANSFORMER MATCHING NETWORK

CROSS REFERENCE TO RELATED APPLICATION

This is a continuation of International Application No. PCT/JP2021/045087 filed on Dec. 8, 2021 which claims priority from Japanese Patent Application No. 2020-218172 filed on Dec. 28, 2020. The contents of these applications are incorporated herein by reference in their entireties.

BACKGROUND ART

Technical Field

The present disclosure relates to an amplifier that amplifies a radio-frequency signal.

Patent Document 1 discloses a radio-frequency power amplifier. The radio-frequency power amplifier disclosed in Patent Document 1 includes transistors connected in cascode, an input matching network, and an output matching network.

Each of the input matching network and the output matching network is constituted by a plurality of inductors and capacitors.

Patent Document 1: Japanese Unexamined Patent Application Publication No. 2012-147307

BRIEF SUMMARY

In an existing radio-frequency power amplifier, such as one disclosed in Patent Document 1, although large gain can be obtained by a cascode connection of transistors, it is difficult to achieve low loss characteristics in a wide frequency band.

Hence, the present disclosure aims to provide an amplifier that can achieve large gain and low loss characteristics in a wide band.

An amplifier according to this disclosure includes a first transistor on a side to which a radio-frequency signal is input and a second transistor on a side to which the radio-frequency signal is output that are connected in cascode, an input matching network connected to an input end of the first transistor, and an output matching network connected to an output end of the second transistor. The input matching network includes a first transmission line transformer. The first transmission line transformer includes a first line and a second line. The first line is connected between an input terminal for the radio-frequency signal and the first transistor. The second line is disposed so as to be able to couple to the first line via an electromagnetic field, one end thereof is connected to a first node between the first line and the input terminal for the radio-frequency signal, and another end thereof is connected between the first line and a ground potential.

In this configuration, large gain is achieved by a cascode connection of the first transistor and the second transistor, and a frequency band in which impedance matching can be provided is increased by the inclusion of the transmission line transformer in the matching network.

This disclosure can achieve large gain and low loss characteristics in a wide band.

DETAILED DESCRIPTION

First Embodiment

Figure 1:
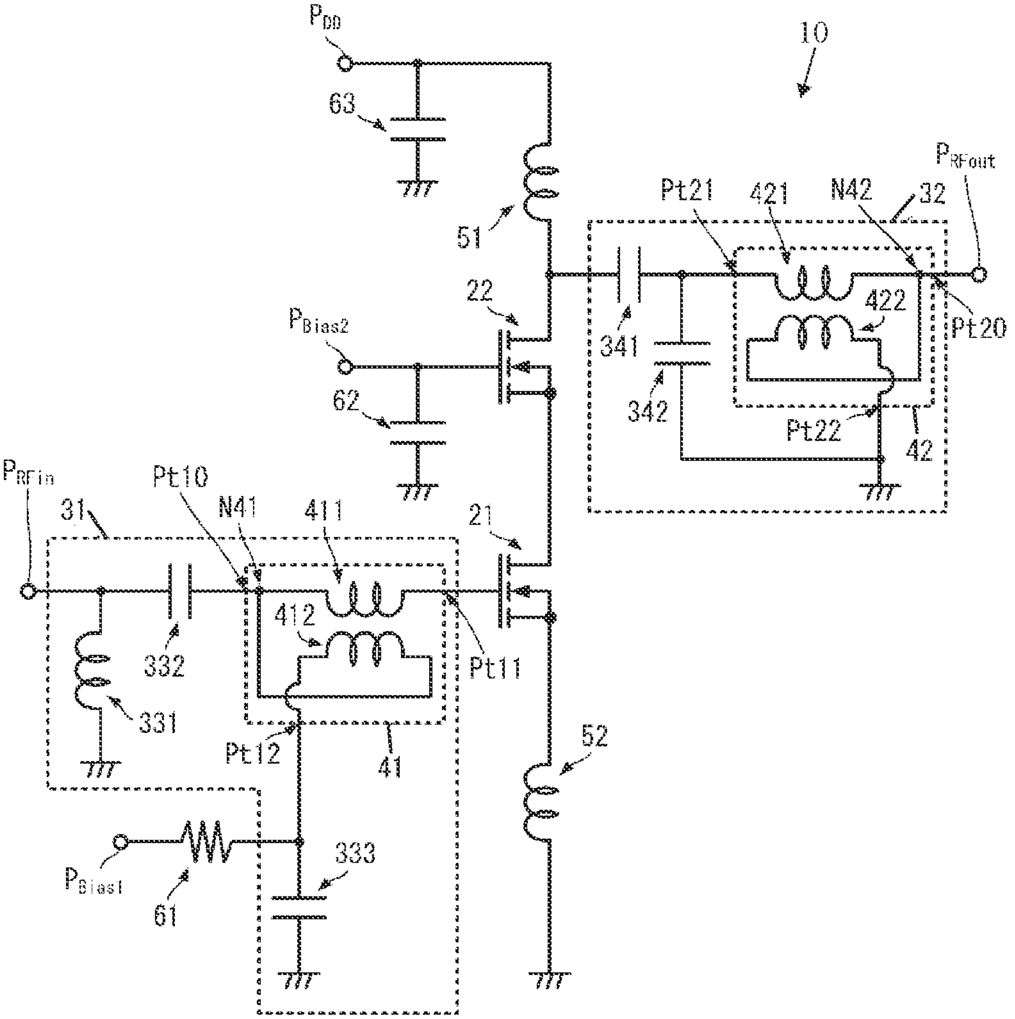
FIG. 1 is an equivalent circuit diagram of an amplifier according to a first embodiment of the present disclosure.

An amplifier according to a first embodiment of the present disclosure will be described with reference to drawings. FIG. 1 is an equivalent circuit diagram of the amplifier according to the first embodiment of the present disclosure.

(Schematic Circuit Configuration of Amplifier 10)

An amplifier 10 is a circuit that amplifies a radio-frequency signal, such as a LNA (Low Noise Amplifier). The frequency band of a radio-frequency signal to be amplified by the amplifier 10 is, for example, a frequency band of about 5 [GHz] or a frequency band of about 7 [GHz].

The amplifier 10 includes a transistor 21, a transistor 22, an input matching network 31, an output matching network 32, an inductor 51, an inductor 52, a resistor 61, a capacitor 62, and a capacitor 63. The amplifier 10 further includes a radio-frequency signal input terminal $P_{RFin}$, a radio-frequency signal output terminal $P_{RFout}$, a bias input terminal $P_{Bias1}$, a bias input terminal $P_{Bias2}$, and a drive voltage application terminal $P_{DD}$. Incidentally, each of these terminals of the amplifier 10 may be of a terminal shape that allows connection to an external circuit or may be a connection conductor to the external circuit.

The transistor 21 and the transistor 22 are, for example, N-channel MOSFETs (Metal Oxide Semiconductor Field Effect Transistors). The transistor 21 corresponds to “first transistor” according to the present disclosure, and the transistor 22 corresponds to “second transistor” according to the present disclosure. Incidentally, the transistor 21 and the transistor 22 may be bipolar transistors. Alternatively, the transistor 21 may be a bipolar transistor, and the transistor 22 may be a MOSFET.

The transistor 21 and the transistor 22 are connected in cascode. More specifically, a source of the transistor 21 is connected to a ground potential through the inductor 52. A drain of the transistor 21 and a source of the transistor 22 are connected to each other. A drain of the transistor 22 is connected to the drive voltage application terminal $P_{DD}$ through the inductor 51. The drive voltage application terminal $P_{DD}$ is connected to the ground potential through the capacitor 63.

The bias input terminal $P_{Bias1}$ is connected to a gate of the transistor 21 through the input matching network 31 and the resistor 61. More specifically, the bias input terminal $P_{Bias1}$ is connected to the gate of the transistor 21 through a transmission line transformer 41, which will be described later, included in the input matching network 31. Furthermore, the bias input terminal $P_{Bias1}$ is connected to the ground potential through a capacitor 333 of the input matching network 31.

The bias input terminal $P_{Bias2}$ is connected to a gate of the transistor 22. The bias input terminal $P_{Bias2}$ is connected to the ground potential through the capacitor 62. In other words, the gate of the transistor 22 is grounded for high frequencies through the capacitor 62.

The radio-frequency signal input terminal $P_{RFin}$ is connected to the gate of the transistor 21 through the input matching network 31. The drain of the transistor 22 is connected to the radio-frequency signal output terminal $P_{RFout}$ through the output matching network 32.

In this configuration, a bias voltage for the transistor 21 is applied from the bias input terminal $P_{Bias1}$. A bias voltage for the transistor 22 is applied from the bias input terminal $P_{Bias2}$. A drive voltage of the transistor 21 and the transistor 22 is applied from the drive voltage application terminal $P_{DD}$. Thus, the amplifier 10 amplifies a radio-frequency signal input from the radio-frequency signal input terminal $P_{RFin}$ with a predetermined amplification factor and outputs the signal from the radio-frequency signal output terminal $P_{RFout}$.

At this time, the transistor 21 and the transistor 22 are connected in cascode as described above, and thus large gain can be achieved.

(Configuration of Input Matching Network 31)

The input matching network 31 includes the transmission line transformer 41, an inductor 331, a capacitor 332, and the capacitor 333. The capacitor 332 corresponds to "first capacitor" according to the present disclosure, and the capacitor 333 corresponds to "second capacitor" according to the present disclosure.

The transmission line transformer 41 includes a line (inductor) 411 and a line (inductor) 412. The transmission line transformer 41 corresponds to "first transmission line transformer" according to the present disclosure. The line 411 corresponds to "first line" according to the present disclosure, and the line 412 corresponds to "second line" according to the present disclosure. Incidentally, the line 411 and the line 412 may be replaced by respective lumped parameters to serve as inductors. In this case, an inductor as a lumped parameter circuit element by which the line 411 is replaced corresponds to "first inductor" according to the present disclosure, and an inductor as a lumped parameter circuit element by which the line 412 is replaced corresponds to "second inductor" according to the present disclosure. In the figure, each of the lines 411 and 412 is represented as an inductor. One end of the line 411 and one end of the line 412 are connected to each other. This connection point serves as a node N41. That is, the one end of the line 412 is connected to the node N41 between the one end of the line 411 and the radio-frequency signal input terminal $P_{RFin}$. The node N41 corresponds to "first node" according to the present disclosure. The line 411 and the line 412 couple to each other via an electromagnetic field so that currents that flow therethrough are opposite in phase to each other.

The node N41 is connected to one end of the capacitor 332. This connection portion serves as a port Pt10 of the transmission line transformer 41.

The other end of the capacitor 332 is connected to the radio-frequency signal input terminal $P_{RFin}$. A connection portion between this capacitor 332 and the radio-frequency signal input terminal $P_{RFin}$ is connected to the ground potential through the inductor 331.

The other end of the line 411 is connected to the gate of the transistor 21. This connection portion serves as a port Pt11 of the transmission line transformer 41.

The other end of the line 412 is connected to one end of the capacitor 333. This connection portion serves as a port Pt12 of the transmission line transformer 41.

The other end of the capacitor 333 is connected to the ground potential. Furthermore, the port Pt12 is connected to the bias input terminal $P_{Bias1}$ through the resistor 61.

In this configuration, impedance matching between an external circuit on a radio-frequency signal input terminal $P_{RFin}$ side and the gate of the transistor 21 on a cascode connection input side is provided mainly by the transmission line transformer 41. Here, the transmission line transformer 41 is almost frequency-independent and can achieve a predetermined impedance ratio (for example, 1:4 in this case) between a port Pt10 side and a port Pt11 side. Hence, when the transmission line transformer 41 is used in the input matching network 31, impedance matching between the external circuit on the radio-frequency signal input terminal $P_{RFin}$ side and the transistor 21 is provided in a wide frequency band.

Furthermore, in the input matching network 31, the capacitor 332 is connected in series with a radio-frequency signal transmission path from the radio-frequency signal input terminal $P_{RFin}$ to the transistor 21, and the inductor 331 is connected in shunt with the radio-frequency signal transmission path. Additionally, in the input matching network 31, a series LC resonant circuit including the line (inductor) 412 of the transmission line transformer 41 and the capacitor 333 is connected in shunt with the radio-frequency signal transmission path from the radio-frequency signal input terminal PREin to the transistor 21.

Thus, the input matching network 31 constitutes a high pass filter. In this high pass filter, an attenuation pole determined by a resonant frequency of the series LC resonant circuit including the line (inductor) 412 of the transmission line transformer 41 and the capacitor 333 can be set in an attenuation range. Hence, for example, assuming that a 5 [GHz] frequency band or 7 [GHz] frequency band is a pass band and that a range of frequencies lower than these is an attenuation range, a high pass filter with an attenuation pole at about 2.5 [GHz] or about 3.5 [GHz] can be provided. Incidentally, numerical values of these frequency bands and attenuation pole frequencies are examples and can be appropriately set in accordance with specifications of the amplifier 10.

Figure 3:
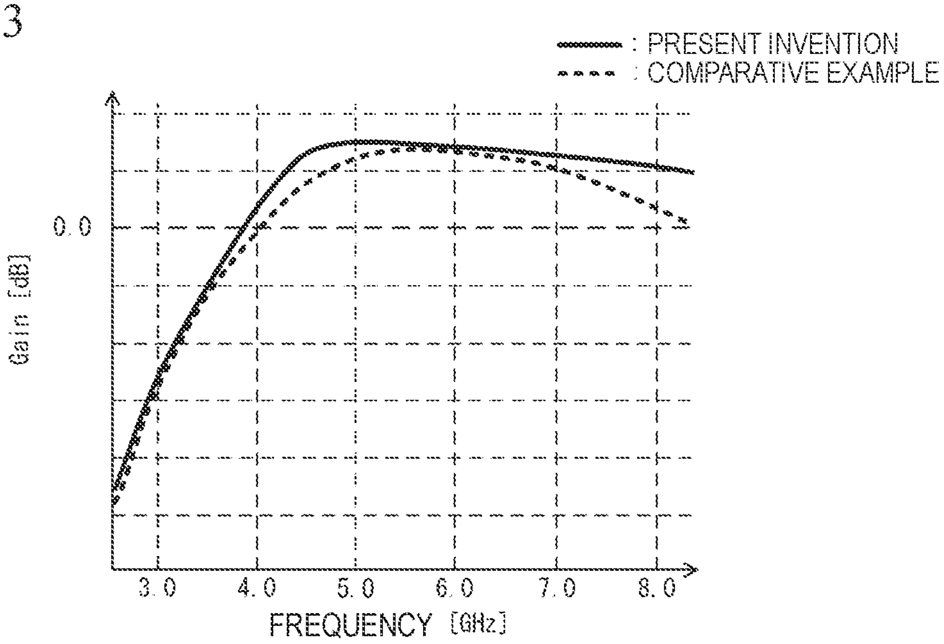
FIG. 3 is a graph illustrating frequency responses of gain in the present disclosure and a comparative example.

FIG. 3 is a graph illustrating frequency responses of gain in the present disclosure and a comparative example. In FIG. 3, a solid line represents a characteristic in the present disclosure, and a dashed line represents the comparative example. The comparative example refers to a configuration similar to that of an existing circuit in which a matching network that does not use a transmission line transformer is employed.

As illustrated in FIG. 3, in the present disclosure, a frequency band in which matching is desired to be provided can be increased, high gain can be maintained, and sufficient attenuation can be obtained at a frequency at which attenuation is desired to be achieved.

As a result, the input matching network 31 can output a radio-frequency signal to be amplified to the transistor 21 with low loss and suppress an unwanted wave of a frequency lower than the radio-frequency signal to be amplified. Furthermore, the input matching network 31 can greatly attenuate an unwanted wave of a particular frequency owing to an attenuation pole.

Furthermore, in this configuration, the line (inductor) 412 of the transmission line transformer 41 is connected between the radio-frequency signal transmission path from the radio-frequency signal input terminal $P_{RFin}$ to the transistor 21 and the bias input terminal $P_{Bias1}$. This can keep a radio-frequency signal from leaking to the bias input terminal $P_{Bias1}$.

Additionally, in this configuration, the bias input terminal $P_{Bias1}$ is connected, through the resistor 61, to a connection portion between the port Pt12 of the transmission line transformer 41 and the capacitor 333 connected to the ground potential. Thus, a time constant can be optimized by the resistor 61 and the capacitor 333, and a bias voltage can be quickly stabilized. Incidentally, a bias voltage to be applied to the transistor 21 herein refers to a voltage to be applied to the gate of the transistor 21, and the time constant is determined by the resistor 61, and the combined capacitance of the capacitor 332, the capacitor 333, and gate capacitance of the transistor 21.

(Configuration of Output Matching Network 32)

The output matching network 32 includes a transmission line transformer 42, a capacitor 341, and a capacitor 342. The transmission line transformer 42 corresponds to "second transmission line transformer" according to the present disclosure.

The transmission line transformer 42 includes a line 421 and a line 422. The line 421 is an example of "third line", and the line 422 is an example of "fourth line". Incidentally, each of the lines 421 and 422 may be replaced by a lumped parameter to serve as an inductor. In this case, an inductor as a lumped parameter circuit element by which the line 421 is replaced corresponds to "third inductor" according to the present disclosure, and an inductor as a lumped parameter circuit element by which the line 422 is replaced corresponds to "fourth inductor" according to the present disclosure. In the figure, each of the lines 421 and 422 is represented as an inductor. One end of the line 421 and one end of the line 422 are connected to each other. This connection point serves as a node N42. The node N42 corresponds to "second node" according to the present disclosure. The line 421 and the line 422 couple to each other via an electromagnetic field so that currents that flow therethrough are opposite in phase to each other.

The node N42 is connected to the radio-frequency signal output terminal $P_{RFout}$. This connection portion serves as a port Pt20 of the transmission line transformer 42.

The other end of the line 421 is connected to one end of the capacitor 341. This connection portion serves as a port Pt21 of the transmission line transformer 42.

The other end of the capacitor 341 is connected to the drain of the transistor 22.

The other end of the line 422 is connected to the ground potential. This connection portion serves as a port Pt22 of the transmission line transformer 42.

One end of the capacitor 342 is connected to the port Pt21 of the transmission line transformer 42 and the one end of the capacitor 341, and the other end thereof is connected to the port Pt21 of the transmission line transformer 42 and the ground potential.

In this configuration, impedance matching between the drain of the transistor 22 on a cascode connection output side and an external circuit on a radio-frequency signal output terminal $P_{RFout}$ side is provided mainly by the transmission line transformer 42. Here, the transmission line transformer 42 is almost frequency-independent as in the transmission line transformer 41 and can achieve a predetermined impedance ratio between a port Pt21 side and a port Pt20 side. Hence, when the transmission line transformer 42 is used in the output matching network 32, impedance matching between the transistor 22 and the external circuit on the radio-frequency signal output terminal $P_{RFout}$ side is provided in a wide frequency band.

Incidentally, the capacitor 342 can be omitted in accordance with demanded specifications of the output matching network 32.

(Function Effects achieved by Overall Configuration)

As described above, the amplifier 10 includes the input matching network 31 and thus can achieve impedance matching for an input side in a wide frequency band. Consequently, the amplifier 10 can achieve large gain with low loss for a wide frequency band.

Furthermore, the amplifier 10 includes the output matching network 32 and thus can achieve impedance matching for an output side in a wide frequency band. Consequently, the amplifier 10 can achieve large gain with low loss for a wide frequency band.

Additionally, the amplifier 10 includes the input matching network 31 and the output matching network 32 and thus can achieve impedance matching for the input side and the output side in a wide frequency band. Consequently, the amplifier 10 can achieve large gain with low loss for a wide frequency band.

Furthermore, the amplifier 10 includes the high pass filter in the input matching network 31 and thus can suppress input of an unwanted wave and suppress deterioration of a noise figure NF. Additionally, an attenuation pole is provided in the attenuation range of the high pass filter in the input matching network 31, and thus the amplifier 10 can more greatly attenuate an unwanted wave of a particular frequency. Consequently, the amplifier 10 can further suppress deterioration of the noise figure NF.

Furthermore, the amplifier 10 can improve an initial rise in bias current owing to the above-described configuration. Thus, the amplifier 10 can amplify a radio-frequency signal quickly after the initial rise and with stability.

Incidentally, in the above description, an inductance between the transmission line transformer 41 and the transmission line transformer 42 is not specifically detailed.

An inductance of the transmission line transformer 41 only has to be set in accordance with an impedance ratio between the external circuit on the radio-frequency signal input terminal $P_{RFin}$ side and the transistor 21 on the cascode connection input side. In other words, the inductance of the transmission line transformer 41 only has to be set so that the impedance as seen from the transistor 21 looking toward the external circuit on the radio-frequency signal input terminal $P_{RFin}$ side is matched to the impedance as seen from the radio-frequency signal input terminal $P_{RFin}$ looking toward the transistor 21.

An inductance of the transmission line transformer 42 only has to be set in accordance with an impedance ratio between the transistor 22 on the cascode connection output side and the external circuit on the radio-frequency signal output terminal $P_{RFout}$ side. In other words, the inductance of the transmission line transformer 42 only has to be set so that the impedance as seen from the transistor 22 looking toward the external circuit on the radio-frequency signal output terminal $P_{RFout}$ side is matched to the impedance as seen from the radio-frequency signal output terminal $P_{RFout}$ looking toward the transistor 22.

That is, when the external circuit on the radio-frequency signal input terminal $P_{RFin}$ side and the external circuit on the radio-frequency signal output terminal $P_{RFout}$ side have different impedances, the inductance of the transmission line transformer 41 and the inductance of the transmission line transformer 42 are different depending on the respective external circuits. Thus, the amplifier 10 can achieve appropriate input-side impedance matching and appropriate output-side impedance matching individually.

Incidentally, when an inductance of a transmission line transformer is changed as described above, the length of a region where two lines (inductors) faces each other, the thicknesses of wires forming the two respective lines (inductors), or the distance between the two inductors only has to be adjusted.

(One Example of Structure of Transmission Line Transformer)

Figure 2:
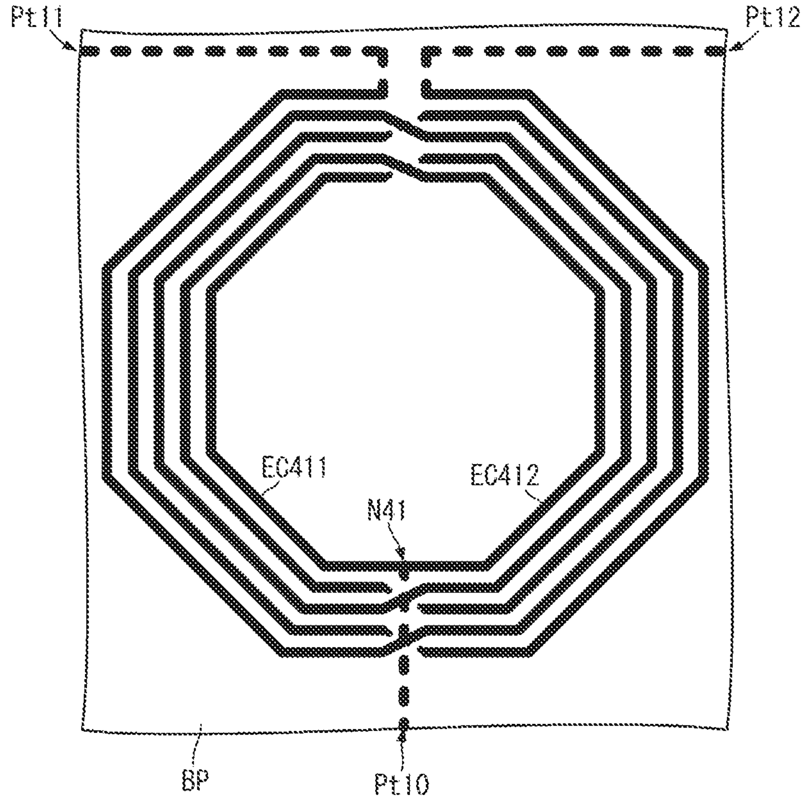
FIG. 2 is a plan view illustrating one example of a structure of a transmission line transformer according to the first embodiment of the present disclosure.

FIG. 2 is a plan view illustrating one example of a structure of a transmission line transformer according to the first embodiment of the present disclosure.

Incidentally, FIG. 2 illustrates a reference sign of each port of the transmission line transformer 41 as an example. The transmission line transformer 42 can also be constructed as in the transmission line transformer 41.

As illustrated in FIG. 2, the transmission line transformer 41 is formed, for example, by a conductor pattern EC411 and a conductor pattern EC412 that are formed in or on an insulating substrate BP. The conductor pattern EC411 and the conductor pattern EC412 are constructed with a linear conductor pattern formed into a winding in or on the insulating substrate BP. As illustrated in FIG. 2, the winding-shaped conductor pattern has a plurality of intersection portions at some points therein. The intersection portions are provided at nearly equal intervals (in the example in FIG. 2, every half the circumference of a winding diameter). In an intersection portion, intersecting conductor patterns are insulated from each other by an insulator forming the insulating substrate BP.

A position at about the midpoint in an extending direction of the winding-shaped conductor pattern is the node N41 and is connected to the port Pt10. One end in the extending direction of the winding-shaped conductor pattern is connected to the port Pt11. The other end in the extending direction of the winding-shaped conductor pattern is connected to the port Pt12. A conductor pattern on one end side with respect to the node N41 is the conductor pattern EC411 and forms the line 411. A conductor pattern on the other end side with respect to the node N41 is the conductor pattern EC412 and forms the line 412.

Incidentally, in this configuration, a case has been described where the conductor pattern EC411 forming the line 411 and the conductor pattern EC412 forming the line 412 are of a winding shape, but the shapes are not limited to this. That is, any other shape may be used as long as the one end of the line 411 and the one end of the line 412 are connected to each other and the line 411 and the line 412 couple to each other via an electromagnetic field at a predetermined degree of coupling so that currents with opposite phases flow therethrough as described above. Note that the use of a winding shape, such as one illustrated in FIG. 2, enables a reduction in the plane area of the transmission line transformer 41.

Second Embodiment

Figure 4:
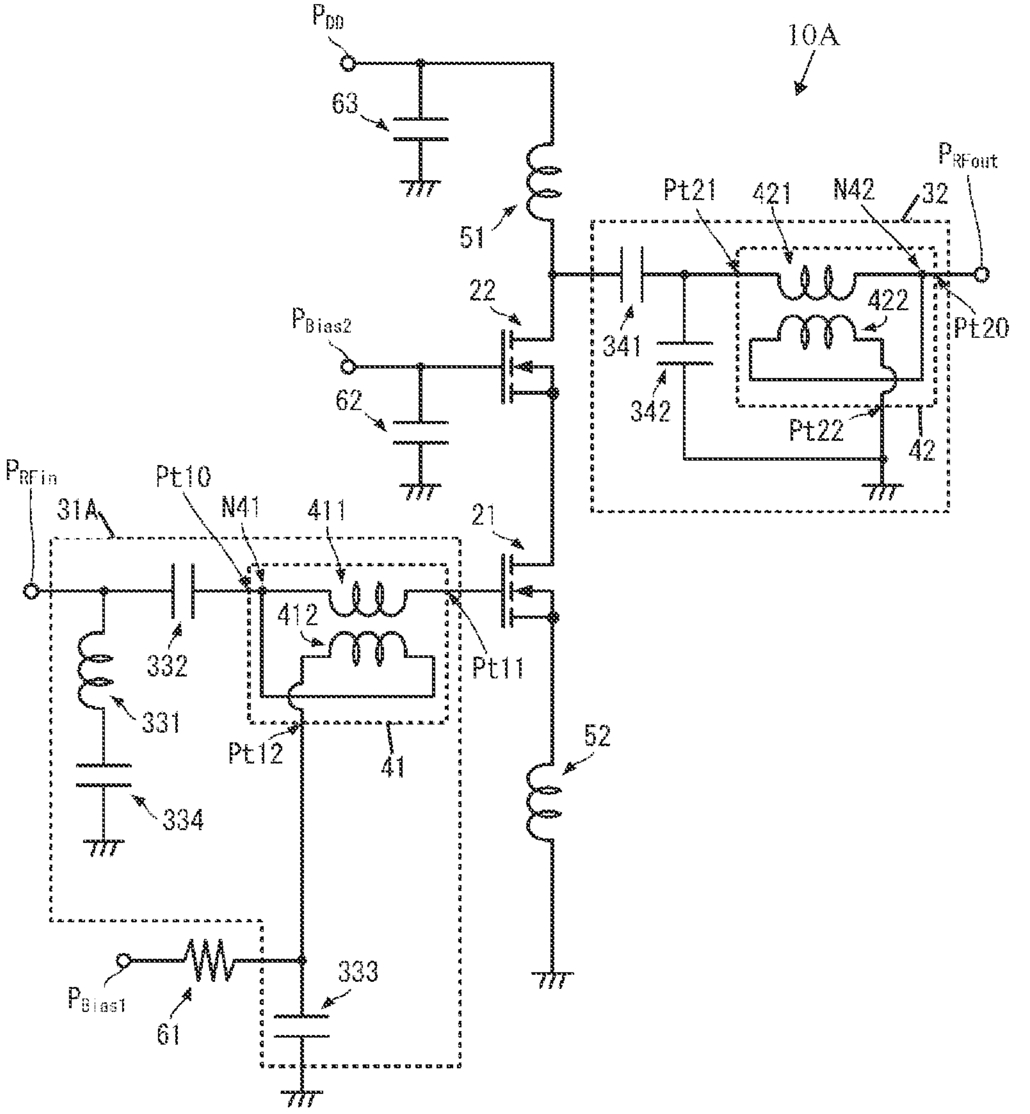
FIG. 4 is an equivalent circuit diagram of an amplifier according to a second embodiment of the present disclosure.

An amplifier according to a second embodiment of the present disclosure will be described with reference to a drawing. FIG. 4 is an equivalent circuit diagram of the amplifier according to the second embodiment of the present disclosure.

As illustrated in FIG. 4, an amplifier 10A according to the second embodiment differs from the amplifier 10 according to the first embodiment in the configuration of an input matching network 31A. Except for the above, the configuration of the amplifier 10A is similar to that of the amplifier 10, and a description of similar portions is omitted.

The amplifier 10A includes the input matching network 31A. The input matching network 31A differs from the input matching network 31 according to the first embodiment in that a capacitor 334 is added.

The capacitor 334 is connected in series with the inductor 331. That is, in the input matching network 31A, a series circuit (series LC resonant circuit) including the inductor 331 and the capacitor 334 is connected in shunt with the radio-frequency signal transmission path from the radio-frequency signal input terminal $P_{RFin}$ to the transistor 21. Incidentally, the inductor 331 is an example of "fifth inductor", and the capacitor 334 is an example of "third capacitor".

Hence, in the input matching network 31A, an attenuation pole determined by a resonant frequency of the series LC resonant circuit including the inductor 331 and the capacitor 334 can be further set in the attenuation range of the high pass filter. At this time, the resonant frequency of the series LC resonant circuit including the inductor 331 and the capacitor 334 is set to be different from the resonant frequency of the series LC resonant circuit including the line (inductor) 412 and the capacitor 333. For example, an inductance of the inductor 331 is made different from an inductance of the line (inductor) 412. This can make the resonant frequencies of the series LC resonant circuits different from each other. Furthermore, the resonant frequencies of the series LC resonant circuits can also be made different from each other by making the capacitance of the capacitor 333 different from the capacitance of the capacitor 334.

Thus, in the input matching network 31A, attenuation poles of a plurality of frequencies can be provided in the attenuation range of the high pass filter. Hence, even if there are a plurality of frequencies of unwanted waves desired to be attenuated greatly, the input matching network 31A can suppress these unwanted waves. As a result, the amplifier 10 can further suppress deterioration of a noise figure NF while achieving large gain in a wide frequency band.

Third Embodiment

Figure 5:
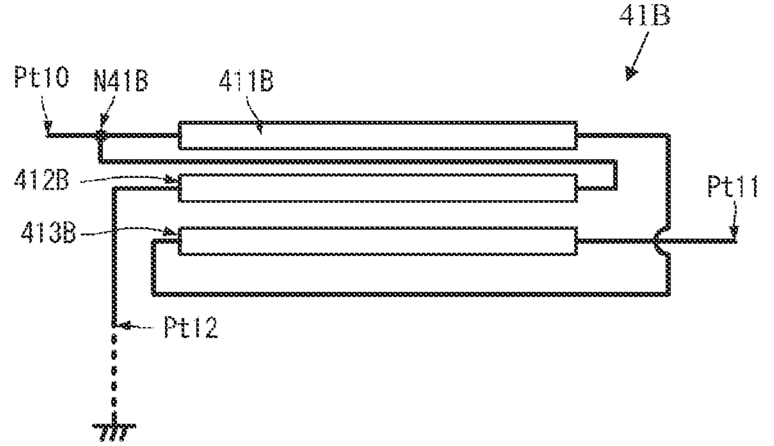
FIG. 5 is a diagram illustrating a schematic configuration of a transmission line transformer of an amplifier according to a third embodiment of the present disclosure.

An amplifier according to a third embodiment of the present disclosure will be described with reference to a drawing. FIG. 5 is a diagram illustrating a schematic configuration of a transmission line transformer of the amplifier according to the third embodiment of the present disclosure.

The amplifier according to the third embodiment differs from the amplifiers 10 and 10A according to the first and second embodiments in the configuration of the transmission line transformer. Except for the above, the configuration of the amplifier according to the third embodiment is similar to those of the amplifiers 10 and 10A according to the first and second embodiments, and a description of similar portions is omitted.

As illustrated in FIG. 5, a transmission line transformer 41B includes a line (inductor) 411B, a line (inductor) 412B, and a line (inductor) 413B. The line 411B, the line 412B, and the line 413B are conductor patterns of shapes extending in respective predetermined directions.

One end of the line 411B and one end of the line 412B are connected to each other. This connection point serves as a node N41B and serves as a port Pt10 of the transmission line transformer 41B. The other end of the line 412B serves as a port Pt12 of the transmission line transformer 41B.

The other end of the line 411B and one end of the line 413B are connected to each other. The other end of the line 413B serves as a port Pt11 of the transmission line transformer 41B.

The line 411B and the line 412B couple to each other via an electromagnetic field so that currents that flow therethrough are opposite in phase to each other. The line 413B and the line 412B couple to each other via an electromagnetic field so that currents that flow therethrough are opposite in phase to each other.

In such a configuration, the transmission line transformer 41B can achieve an impedance ratio different from the transmission line transformer 41. For example, the transmission line transformer 41B can achieve an impedance ratio of 1:9.

Through the use of this transmission line transformer 41B, the amplifier can achieve more diverse impedance matching patterns.

Fourth Embodiment

Figure 6:
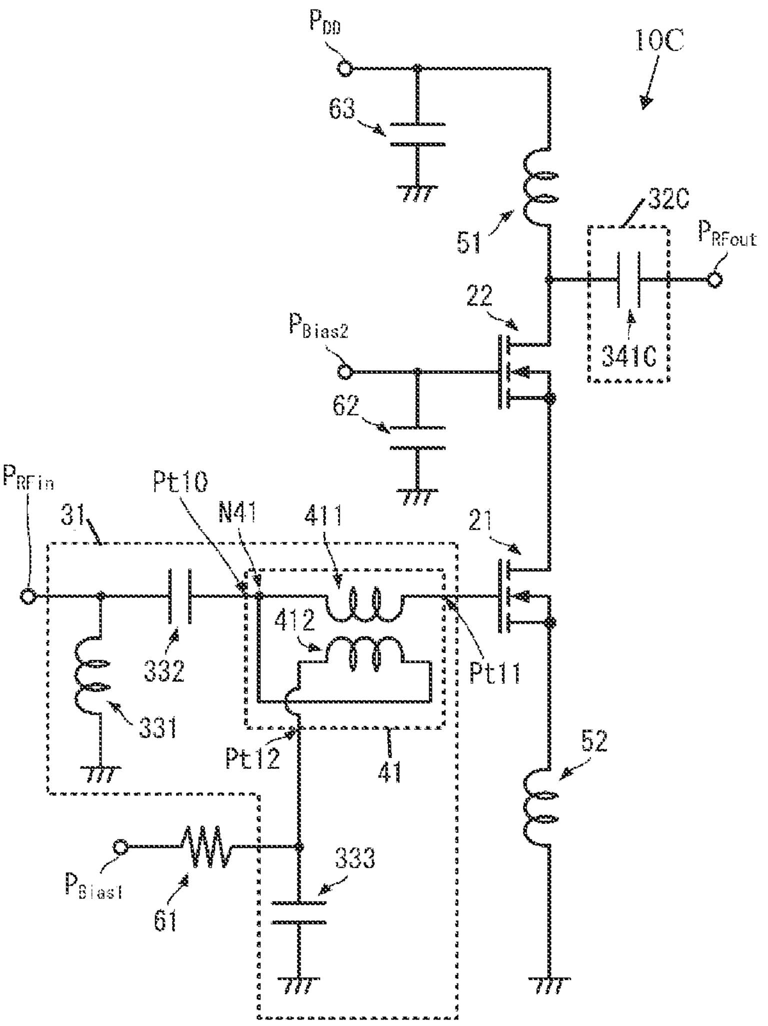
FIG. 6 is an equivalent circuit diagram of an amplifier according to a fourth embodiment of the present disclosure.

An amplifier according to a fourth embodiment of the present disclosure will be described with reference to a drawing. FIG. 6 is an equivalent circuit diagram of the amplifier according to the fourth embodiment of the present disclosure.

As illustrated in FIG. 6, an amplifier 10C according to the fourth embodiment differs from the amplifier 10 according to the first embodiment in the configuration of an output matching network 32C. Except for the above, the configuration of the amplifier 10C is similar to that of the amplifier 10, and a description of similar portions is omitted.

The amplifier 10C includes the output matching network 32C. The output matching network 32C includes a capacitor 341C. The capacitor 341C is connected between the drain of the transistor 22 and the radio-frequency signal output terminal $P_{RFout}$.

In this configuration, the amplifier 10C uses the transmission line transformer 41 only in the matching network on an input side of a group of the transistors connected in cascode. Even such a configuration can achieve large gain and suppression of loss in a wide frequency band in comparison with a case where no transmission line transformer is used both in an input matching network and an output matching network. Furthermore, in this configuration, a circuit configuration of the output matching network 32C is simplified. Hence, for the amplifier 10C, a simpler circuit configuration can be achieved.

Fifth Embodiment

Figure 7:
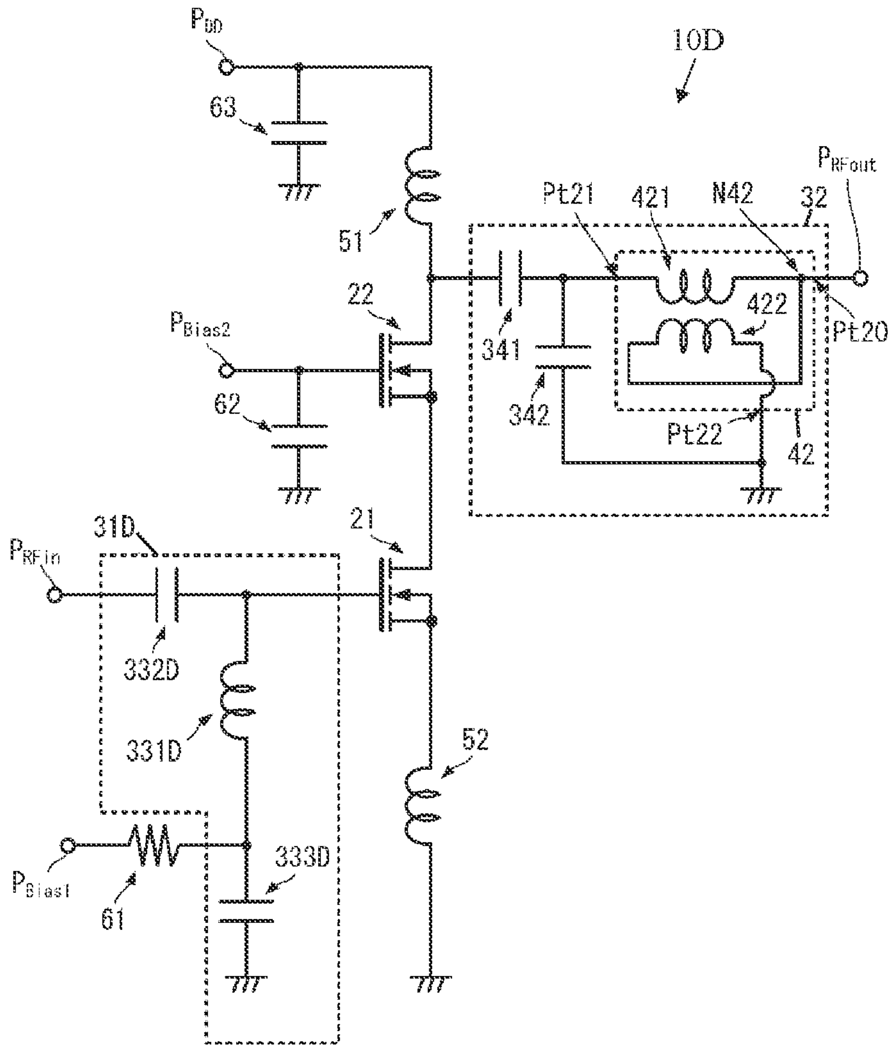
FIG. 7 is an equivalent circuit diagram of an amplifier according to a fifth embodiment of the present disclosure.

An amplifier according to a fifth embodiment of the present disclosure will be described with reference to a drawing. FIG. 7 is an equivalent circuit diagram of the amplifier according to the fifth embodiment of the present disclosure.

As illustrated in FIG. 7, an amplifier 10D according to the fifth embodiment differs from the amplifier 10 according to the first embodiment in the configuration of an input matching network 31D. Except for the above, the configuration of the amplifier 10C is similar to that of the amplifier 10, and a description of similar portions is omitted.

The amplifier 10D includes the input matching network 31D. The input matching network 31D includes an inductor 331D, a capacitor 332D, and a capacitor 333D.

The capacitor 332D is connected between the radio-frequency signal input terminal $P_{RFin}$ and the gate of the transistor 21. A connection portion between this capacitor 332 and the gate of the transistor 21 is connected to the ground potential through a series LC resonant circuit including the inductor 331D and the capacitor 333D.

In this configuration, the amplifier 10D uses the transmission line transformer 42 only in the matching network on an output side of a group of the transistors connected in cascode. Even such a configuration can achieve large gain and suppression of loss in a wide frequency band in comparison with a case where no transmission line transformer is used both in an input matching network and an output matching network. Furthermore, in this configuration, a circuit configuration of the input matching network 31D is simplified. Hence, for the amplifier 10D, a simpler circuit configuration can be achieved. At this time, it is desirable that the input matching network 31D has at least a high pass filter function as in the input matching network 31. This can suppress input of an unwanted wave to the transistor 21.

Incidentally, in each embodiment described above, the resistor 61 is connected to the bias input terminal $P_{Bias1}$. This resistor 61 can be omitted. However, the provision of the resistor 61 can provide a quick initial rise in bias current as described above, and thus it is desirable that the resistor 61 is provided.

REFERENCE SIGNS LIST

10, 10A, 10C, 10D amplifier
21, 22 transistor
31, 31A, 31D input matching network
32, 32C output matching network
41, 41B, 42 transmission line transformer
51, 52 inductor
61 resistor
62, 63 capacitor
331, 331D inductor
332, 332D, 333, 333D, 334, 341, 341C, 342 capacitor
411, 411B, 412, 412B, 413B, 421, 422 line
EC411, EC412 conductor pattern
N41, N41B, N42 node
$P_{Bias1}$ bias input terminal
$P_{Bias2}$ bias input terminal
$P_{DD}$ drive voltage application terminal
$P_{RFin}$ radio-frequency signal input terminal
$P_{RFout}$ radio-frequency signal output terminal
Pt10, Pt11, Pt12, Pt20, Pt21, Pt22 port

The invention claimed is:

1. An amplifier comprising:

a first transistor to which a radio-frequency signal is input;

a second transistor from which the radio-frequency signal is output, the first and second transistors being cascode connected;

an input matching network connected to an input of the first transistor; and an output matching network connected to an output of the second transistor, wherein the input matching network comprises a first transmission line transformer, and wherein the first transmission line transformer comprises:

a first line connected in series between a radio-frequency signal input terminal and the first transistor, and a second line configured to couple to the first line via an electromagnetic field, and having a first end connected to a first node between the first line and the radio-frequency signal input terminal and a second end connected to a ground potential.

2. An amplifier comprising:

a first transistor to which a radio-frequency signal is input; a second transistor from which the radio-frequency signal is output, the first and second transistors being cascode connected;

an input matching network connected to an input of the first transistor; and an output matching network connected to an output of the second transistor, wherein the output matching network comprises a second transmission line transformer, and wherein the second transmission line transformer comprises:

a third line connected in series between a radio-frequency signal output terminal and the second transistor, and a fourth line configured to couple to the third line via an electromagnetic field, and having a first end connected to a second node between the third line and the radio-frequency signal output terminal and a second end connected to a ground potential.

3. The amplifier according to claim 1, wherein the output matching network comprises a second transmission line transformer, and wherein the second transmission line transformer comprises:

a third line connected between a radio-frequency signal output terminal and the second transistor, and a fourth line configured to couple to the third line via an electromagnetic field, and having a first end connected to a second node between the third line and the radio-frequency signal output terminal and a second end connected between the third line and the ground potential.

4. The amplifier according to claim 3, wherein an inductance of the first transmission line transformer is different from an inductance of the second transmission line transformer.

5. The amplifier according to claim 1, wherein an inductance of the first line is equal to an inductance of the second line.

6. The amplifier according to claim 5, wherein a bias input terminal for the first transistor is connected to the second end of the second line.

7. The amplifier according to claim 5, further comprising:

a first capacitor connected in series between the first node and the radio-frequency signal input terminal.

8. The amplifier according to claim 5, further comprising:

a second capacitor connected between the second line and the ground potential.

9. The amplifier according to claim 1, wherein the first line is a first inductor, and wherein the second line is a second inductor.

10. The amplifier according to claim 2, wherein the third line is a third inductor, and wherein the fourth line is a fourth inductor.

11. The amplifier according to claim 1, further comprising:

a fifth inductor and a third capacitor connected in series between the radio-frequency signal input terminal and the ground potential.

12. The amplifier according to claim 2, further comprising:

a fifth inductor and a third capacitor connected in series between the radio-frequency signal input terminal and the ground potential.

13. The amplifier according to claim 1, further comprising:

a fifth inductor and a third capacitor connected between the radio-frequency signal input terminal and the ground potential, wherein an inductance of the fifth inductor is different from an inductance of the second line.

14. The amplifier according to claim 1, wherein a first end of the first line is connected to the first node, and a second end of the first line is connected to a gate of the first transistor.

15. The amplifier according to claim 1, further comprising:

a sixth inductor connected between a source of the first transistor and the ground potential, the sixth inductor being different from the second line.

16. The amplifier according to claim 1, wherein a first end of the first line and the first end of the second line are each connected to the first node.

17. The amplifier according to claim 2, wherein a first end of the third line and the first end of the fourth line are each connected to the second node.

* * * * *